US009349417B2

(12) United States Patent
Mao et al.

(10) Patent No.: US 9,349,417 B2
(45) Date of Patent: May 24, 2016

(54) ELECTRONIC APPARATUS AND COVER MECHANISM THEREFOR

(71) Applicant: Wistron Corporation, New Taipei (TW)

(72) Inventors: Zhong-hui Mao, New Taipei (TW); Dong-Ying Chen, New Taipei (TW)

(73) Assignee: Wistron Corporation, Hsichih, New Taipei (TW)

( * ) Notice: Subject to any disclaimer, the term of this patent is extended or adjusted under 35 U.S.C. 154(b) by 122 days.

(21) Appl. No.: 14/284,382

(22) Filed: May 21, 2014

(65) Prior Publication Data
US 2015/0189776 A1 Jul. 2, 2015

(30) Foreign Application Priority Data

Dec. 27, 2013 (CN) .......................... 2013 1 0740217

(51) Int. Cl.
| A47B 88/00 | (2006.01) |
| G11B 33/12 | (2006.01) |
| H05K 5/02 | (2006.01) |
| G06F 1/18 | (2006.01) |
| E05D 15/58 | (2006.01) |

(52) U.S. Cl.
CPC ................ *G11B 33/125* (2013.01); *G06F 1/18* (2013.01); *H05K 5/0239* (2013.01); *E05D 15/58* (2013.01); *G06F 1/181* (2013.01)

(58) Field of Classification Search
CPC ............ G06F 1/18; G06F 1/16; G06F 1/181; G06F 1/182; H05K 5/0226; H05K 5/0217; H05K 5/0239; H05K 5/0204; H05K 5/0221; H05K 5/03; E05D 15/505; E05D 15/507; E05D 15/502; E05D 15/58; E05D 2015/286; Y10T 16/53607; Y10T 16/5362; Y10T 16/5448; Y10T 16/5323; E06B 3/5054; E06B 3/5063; E06B 3/5072; E06B 3/509; H02B 1/38; A47B 81/00
See application file for complete search history.

(56) References Cited

U.S. PATENT DOCUMENTS

| 2,669,499 | A | * | 2/1954 | Vanderplank | ......... E06B 3/5045 16/88 |
| 2,925,081 | A | * | 2/1960 | Shooter | ................. F24C 15/023 126/190 |
| 6,603,655 | B2 | * | 8/2003 | Hrehor, Jr. | ................ E05D 3/06 16/366 |
| 8,250,711 | B1 | * | 8/2012 | Chen | ....................... E05D 7/081 16/239 |
| 2006/0221580 | A1 | * | 10/2006 | Bliven | .................... G06F 1/181 361/727 |
| 2014/0055938 | A1 | * | 2/2014 | Hsu | ....................... G06F 1/1624 361/679.21 |

FOREIGN PATENT DOCUMENTS

CN            201259651 Y          6/2009

* cited by examiner

*Primary Examiner* — Daniel J Troy
*Assistant Examiner* — Andres F Gallego
(74) *Attorney, Agent, or Firm* — Winston Hsu; Scott Margo (57) ABSTRACT

An electronic apparatus includes an apparatus casing, using a cover mechanism, and a device unit, disposed inside the apparatus casing. The apparatus casing includes a casing body, a pivotal device, a pivot locking mechanism, and a door. The casing body structurally constrains the door to move in a direction at a side of the casing body. After sliding, the door is engaged with the pivotal device and drives the pivot locking mechanism to unlock the pivotal device so that the door can rotate to another side of the casing body by the pivotal device relative to the casing body. A manipulation area of the casing body is therefore exposed. Thereby, a user can manipulate the device unit through the manipulation area; the inner surface of the door keeps facing toward the casing body so that the apparatus casing can keep its aesthetic appearance.

23 Claims, 10 Drawing Sheets

ELECTRONIC APPARATUS AND COVER MECHANISM THEREFOR

BACKGROUND OF THE INVENTION

1. Field of the Invention

The invention relates to a cover mechanism used in an apparatus casing of an electronic apparatus, and especially relates to a cover mechanism for convenience of manipulation of a device installed inside an apparatus casing.

2. Description of the Prior Art

As electronic products develop more and more maturely, consumers' demand for electronic products becomes increasingly high. They desire the electronic products to have powerful functions, stable performance, and aesthetic appearance and provide human-based manipulation. Casings for most network storage equipment are usually made by a metal casing with a decoration panel. The decoration panel is provided with a movable door thereon for convenience of a user to maintain a system or detach and replace a device unit configured in the metal casing. In the current market, most common movable doors are manipulated by lifting and rotating. When the movable door is lifted and rotated to an angle for opening, the movable door still stays in front of the decoration panel after opened, and the user then can manipulate the equipment. When maintenance of the system or detachment and replacement for the device unit is proceeding, the user may probably collide with the opened door leading to damage to the door or the device unit. In addition, the outer surface and inner surface of the door are visible to the user. The door usually has some appearance defects inherent in plastic injection products on the inner surface, such as marks by ejector pins, traces by sliders, gate marks and so on, which adversely affect the appearance of the door.

SUMMARY OF THE INVENTION

An objective of the invention is to provide a cover mechanism for an apparatus casing. The cover mechanism uses sliding and rotating to keep the inner surface of a door thereof facing toward a casing body of the apparatus casing so that the apparatus casing can keep its aesthetic appearance.

The cover mechanism of the invention is used in an apparatus casing and includes a casing body, a pivotal device, pivot locking mechanism, and a door. The casing body has a first side and a second side adjacent to the first side. The casing body includes a guiding structure at the first side. The casing body thereon defining a manipulation area at the first side. The pivotal device is pivotally connected to the casing body. The pivot locking mechanism is disposed for locking or unlocking the pivotal device to correspondingly prevent or allow rotating of the pivotal device relative to the casing body. The door includes an unlocking part. The guiding structure structurally constrains the door so that the door is capable of sliding in a sliding direction at the first side. The unlocking part is capable of driving the pivot locking mechanism to unlock the pivotal device. Therein, the door has a closed position, a rotatable position, and an open position. When the door is located at the closed position, the door covers the manipulation area, and the door is capable of sliding parallel to the sliding direction from the closed position to the rotatable position by the guiding structure. When the door is located at the rotatable position, the door is engaged with the pivotal device, and the unlocking part drives the pivot locking mechanism to unlock the pivotal device so that the door is capable of rotating from the rotatable position to the open position relative to the casing body by the pivotal device. When the door is located at the open position, the door is close to the second side, and the manipulation area is exposed.

Another objective of the invention is to provide an electronic apparatus, which uses the cover mechanism of the invention so that the inner surface of the door keep keeps facing toward the casing body and the apparatus casing can keep its aesthetic appearance.

The electronic apparatus of the invention includes an apparatus casing and a device unit. The apparatus casing includes a casing body, a pivotal device, a pivot locking mechanism, and a door. The casing body has a first side and a second side adjacent to the first side. The casing body forms an accommodating space. The casing body includes a guiding structure at the first side. The casing body thereon defines a manipulation area at the first side corresponding to the accommodating space. The pivotal device is pivotally connected to the casing body. The pivot locking mechanism is disposed for locking or unlocking the pivotal device to correspondingly prevent or allow rotating of the pivotal device relative to the casing body. The door includes an unlocking part. The guiding structure structurally constrains the door so that the door is capable of sliding in a sliding direction at the first side. The unlocking part is capable of driving the pivot locking mechanism to unlock the pivotal device. The device unit is disposed in the accommodating space corresponding to the manipulation area. Therein, the door has a closed position, a rotatable position, and an open position. When the door is located at the closed position, the door covers the manipulation area, and the door is capable of sliding parallel to the sliding direction from the closed position to the rotatable position by the guiding structure. When the door is located at the rotatable position, the door is engaged with the pivotal device, and the unlocking part drives the pivot locking mechanism to unlock the pivotal device so that the door is capable of rotating from the rotatable position to the open position relative to the casing body by the pivotal device. When the door is located at the open position, the door is close to the second side, and the manipulation area is exposed so that the device unit is capable of being manipulated through the manipulation area.

Compared with the prior art, during the opening of the door of the invention, i.e. sliding from the closed position to the rotatable position and rotating from the rotatable position to the open position, the inner surface of the door keeps facing the casing body so that it is not easy for a user to see the inner surface and the apparatus casing can keep its aesthetic appearance. Furthermore, when the door is located at the open position, the door is prone on the second side of the casing body so that the user will not touch the door easily, and even when the door is impacted, the impact energy can be transferred to the casing body so that the door will not be damaged due to suffering an excessive external force alone.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
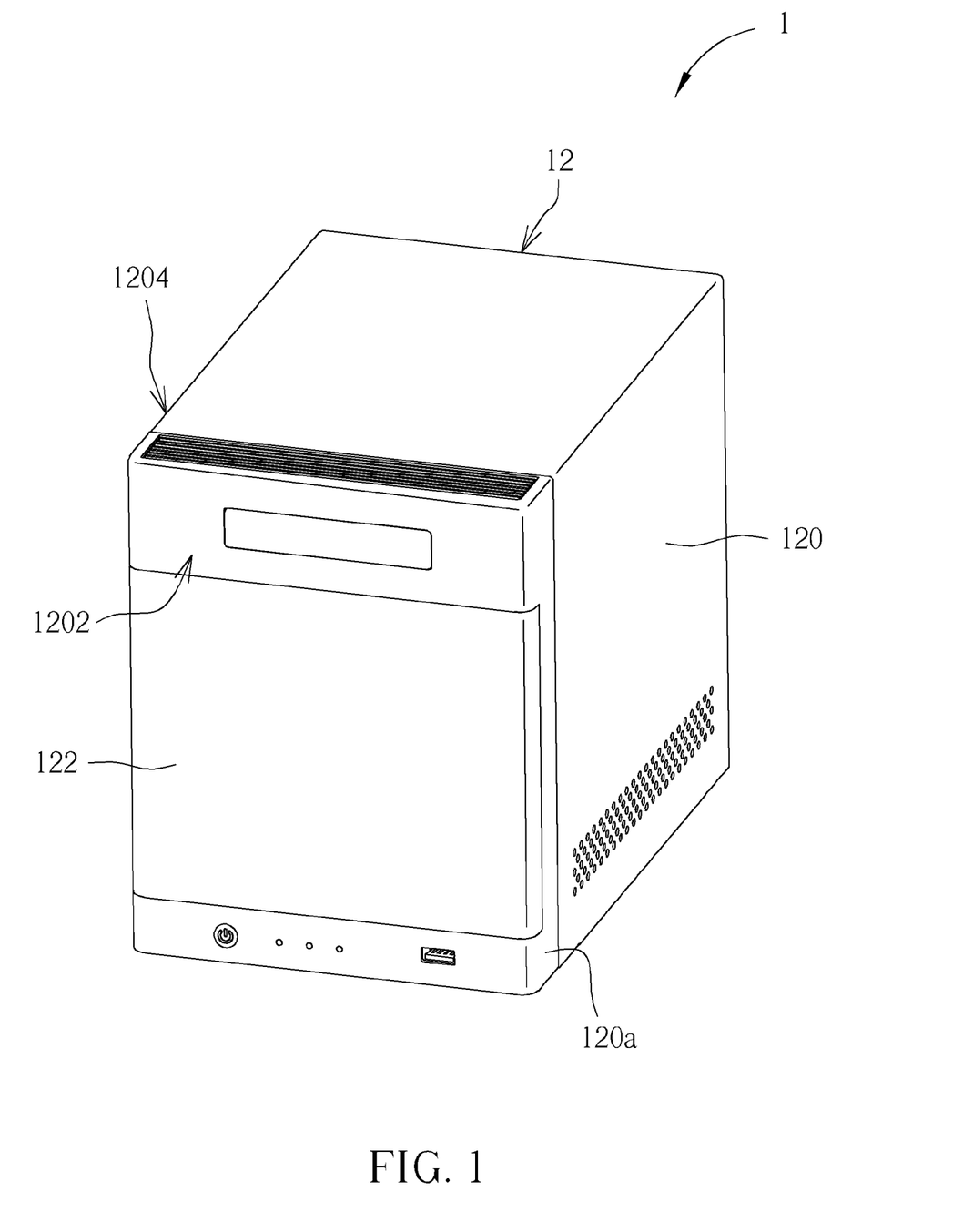
FIG. 1 is a schematic diagram illustrating an electronic apparatus of a preferred embodiment according to the invention.
Figure 2:
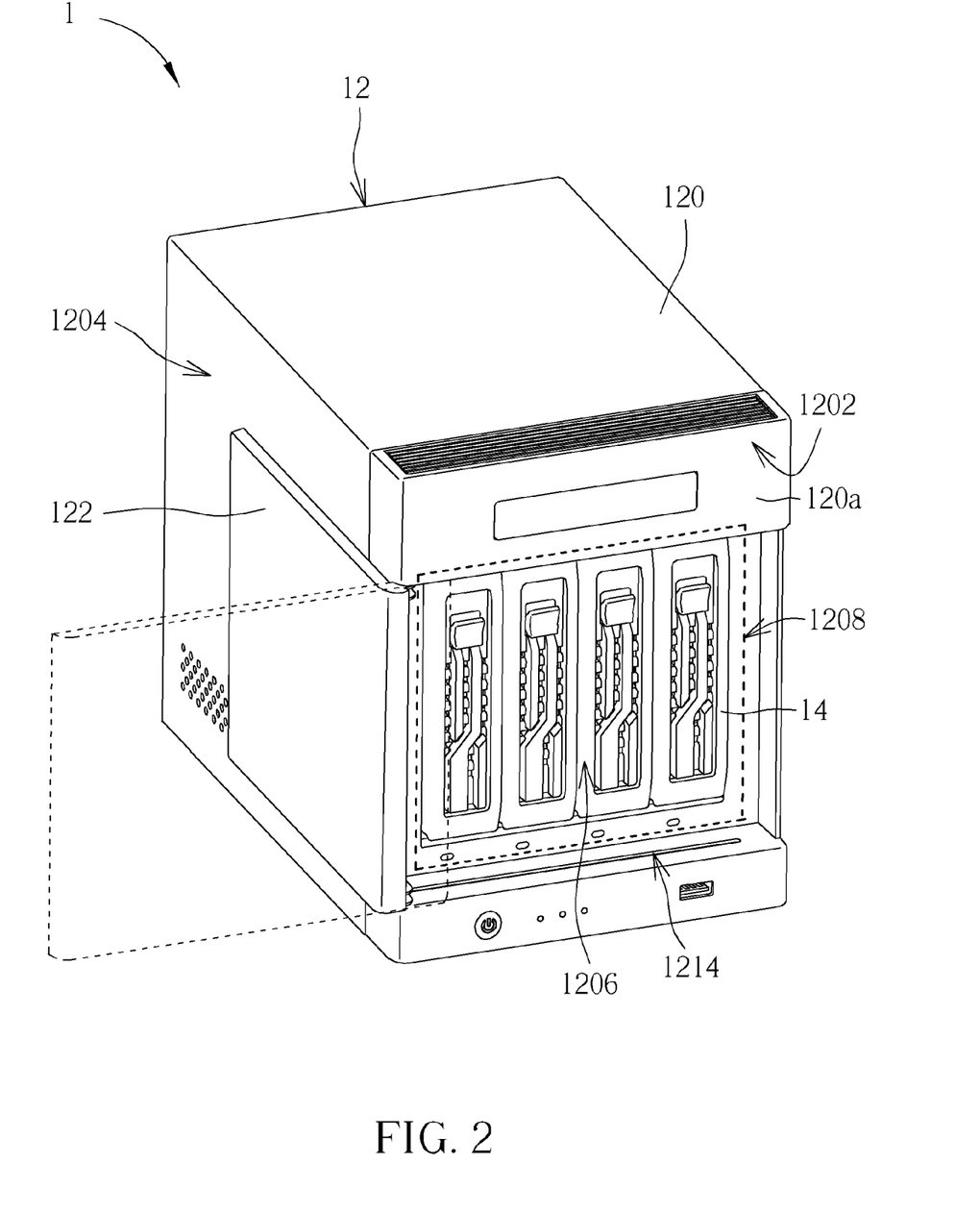
FIG. 2 is a schematic diagram illustrating the electronic apparatus in FIG. 1 with a door of an apparatus casing opened.

Please refer to FIG. 1 and FIG. 2. FIG. 1 is a schematic diagram illustrating an electronic apparatus 1 of a preferred embodiment according to the invention. FIG. 2 is a schematic diagram illustrating opening the electronic apparatus 1. The electronic apparatus 1 includes an apparatus casing 12 and a plurality of device units 14 disposed in the apparatus casing 12. The apparatus casing 12 includes a casing body 120 having a first side 1202 and a second side 1204 adjacent to the first side 1202. The casing body 120 forms an accommodating space 1206 (i.e. the accommodating space formed inside the casing body 120, the location of which is indicated by an arrow in FIG. 2). The casing body 120 thereon defines a manipulation area 1208 (indicated by a bold frame in FIG. 2) at the first side 1202 corresponding to the accommodating space 1206. The device units 14 are disposed in the accommodating space 1206 corresponding to the manipulation area 1208. The apparatus casing 12 further includes a door 122 operably engaged with the casing body 120 so that the door is capable of being closed to cover the manipulation area 1208 or opened to expose the manipulation area 1208. Therein, the door 122 has a closed position, a rotatable position, and an open position relative to the casing body 120. When the door 122 is located at the closed position, the door 122 covers the manipulation area 1208, as shown by FIG. 1. The door 122 needs to slide parallel to the first side 1202 relative to the apparatus casing 12 to the rotatable position (as shown in dashed lines in FIG. 2) so that the door 122 can rotate relative to the apparatus casing 12 toward the second side 1204 so as to be located at the open position (as shown in solid lines in FIG. 2). In the embodiment, the device unit 14 can be a removable device (such as hard disk). When the door 122 is opened, a user can perform operation of inspection, replacement and so on to the device unit 14 through the manipulation area 1208. At the moment, the manipulation area 1208 is taken as a channel for installation or replacement of the device unit 14; however, the invention is not limited thereto. In practice, the manipulation area 1208 thereon disposes a control panel electrically connected to the device unit 14. The user can perform operation of monitoring, setting and so on to the device unit 14 by the control panel.

Figure 3:
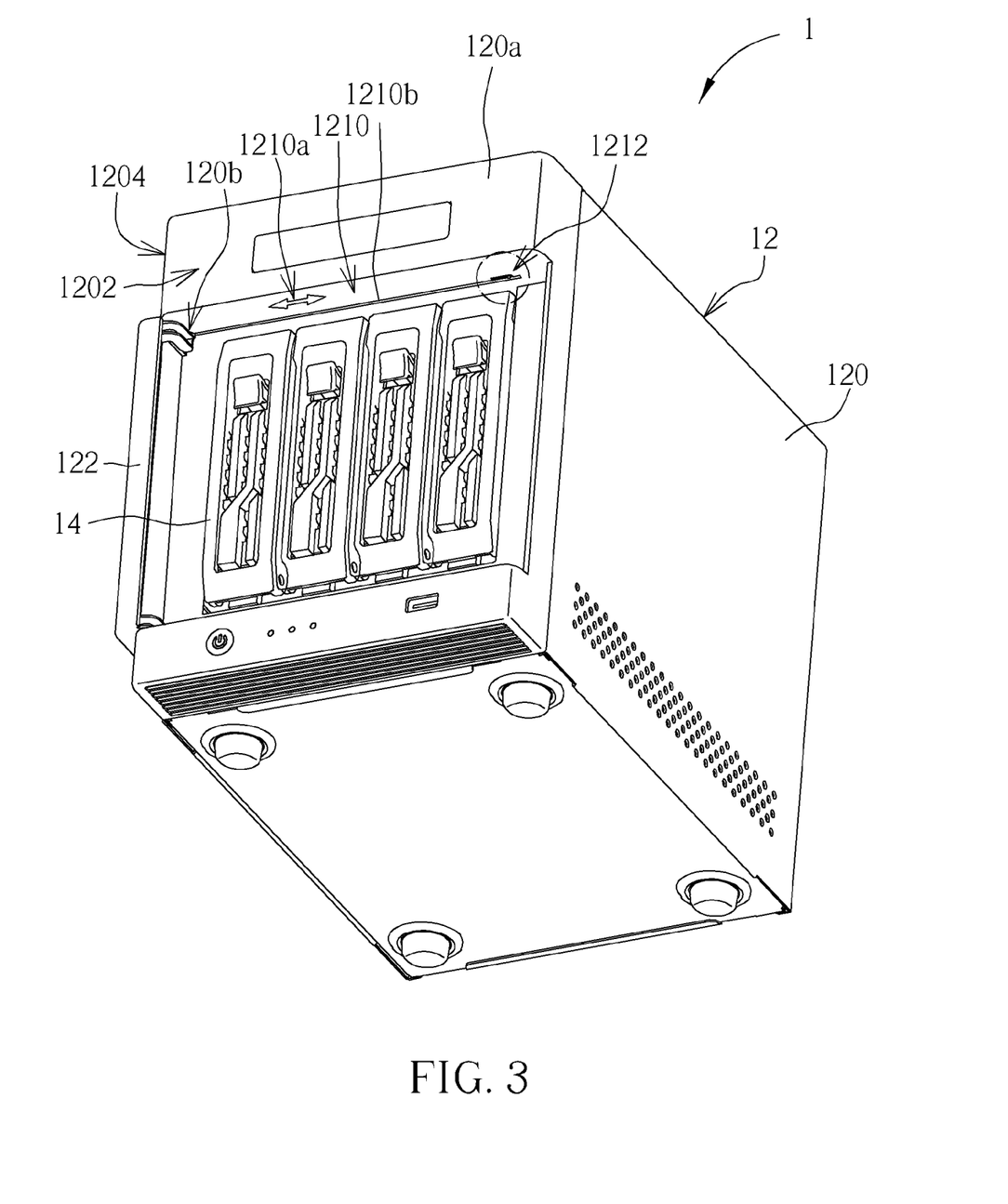
FIG. 3 is a schematic diagram illustrating the electronic apparatus in FIG. 1 with the door opened in another view.
Figure 4:
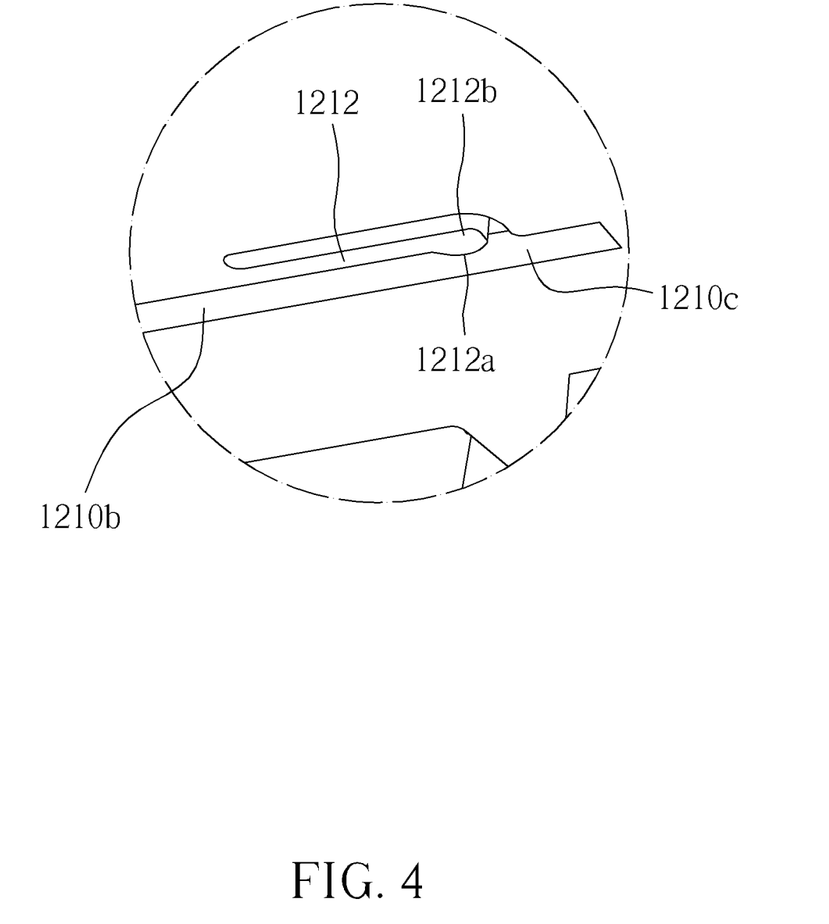
FIG. 4 is an enlarged view of the portion indicated by a circle in FIG. 3.
Figure 5:
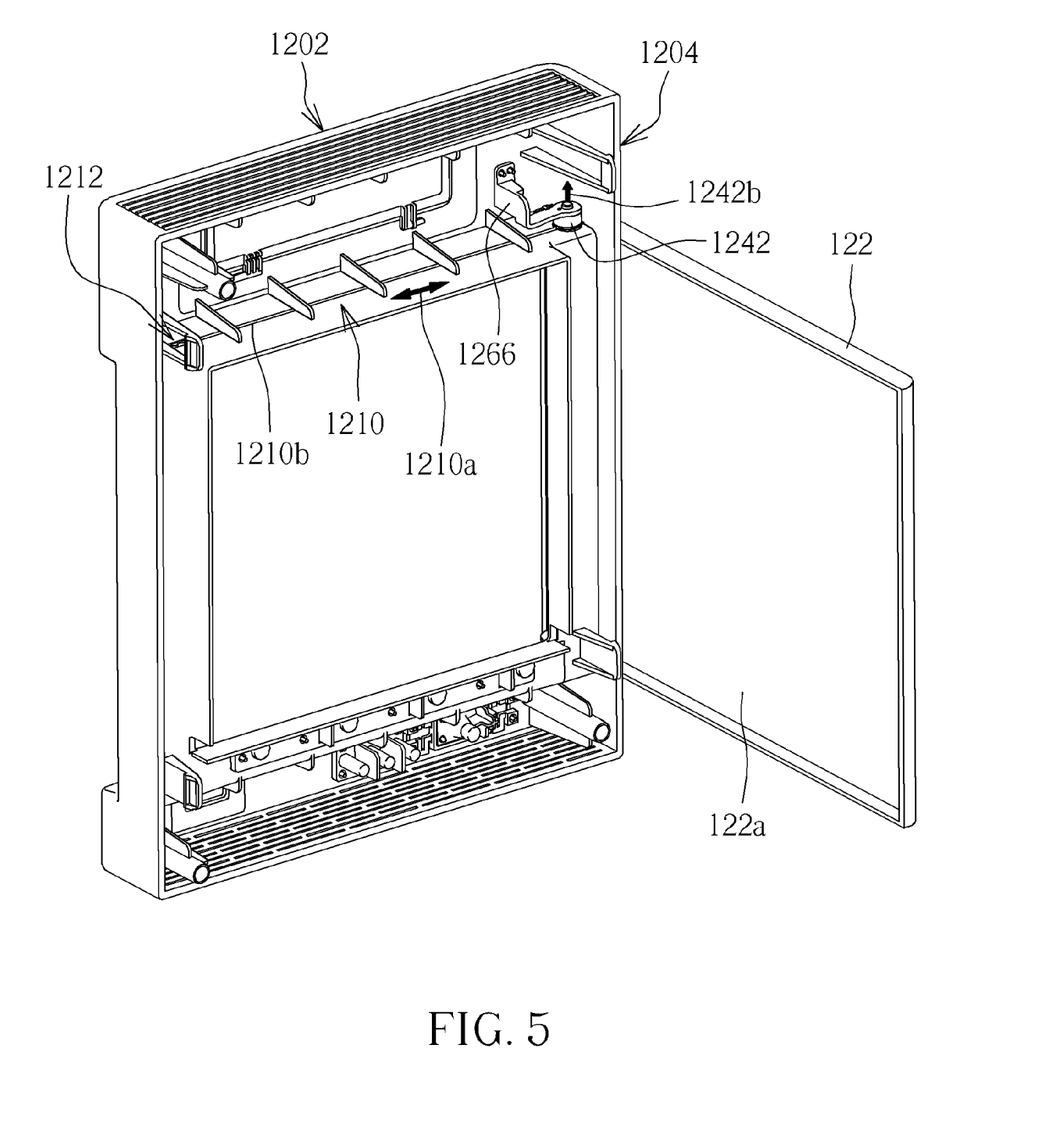
FIG. 5 is a schematic diagram illustrating the engagement of the door with a front cover of a casing body in FIG. 3 in another view.
Figure 6:
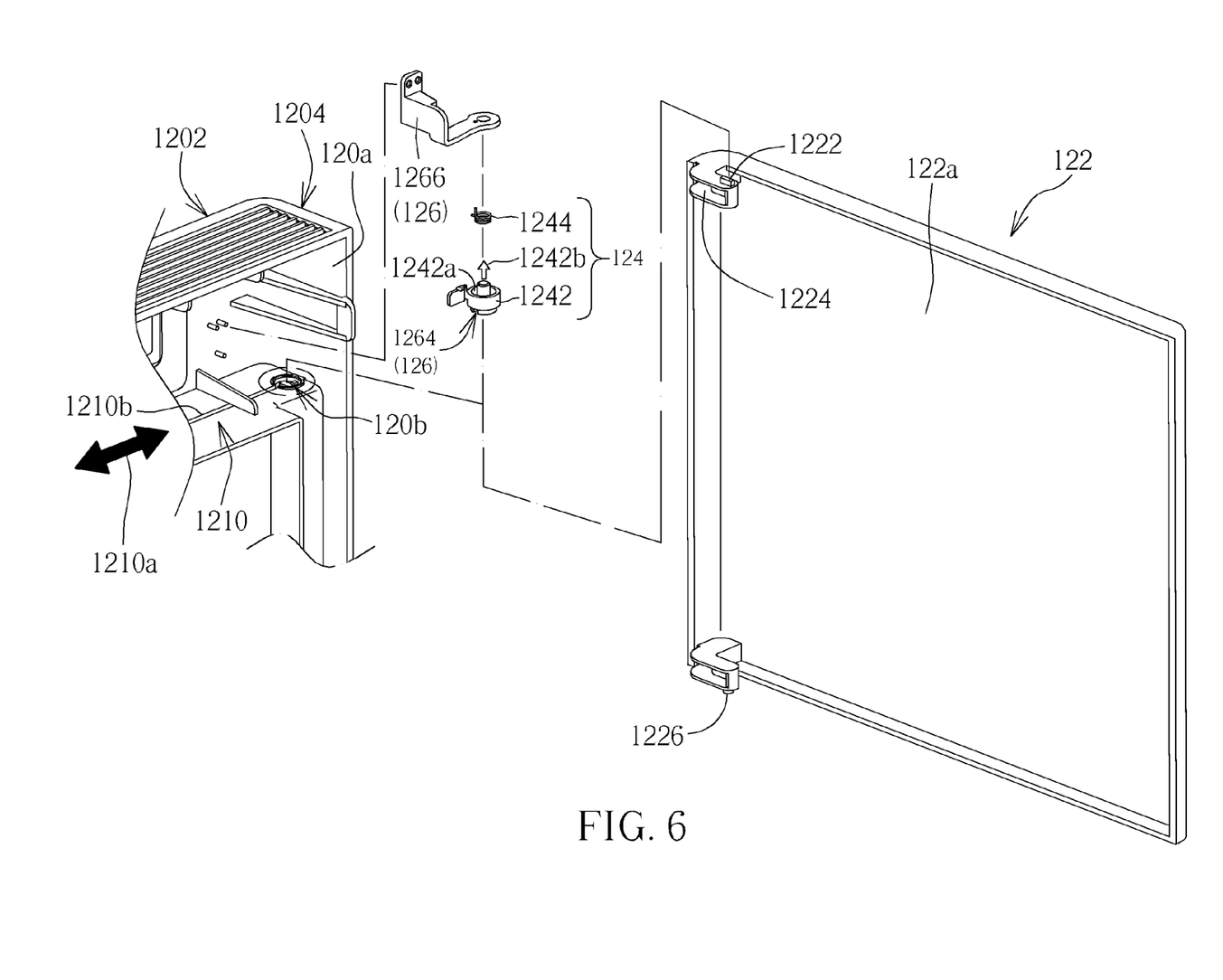
FIG. 6 is an exploded view of the engagement of the door with the front cover of the casing body in FIG. 5.
Figure 7:
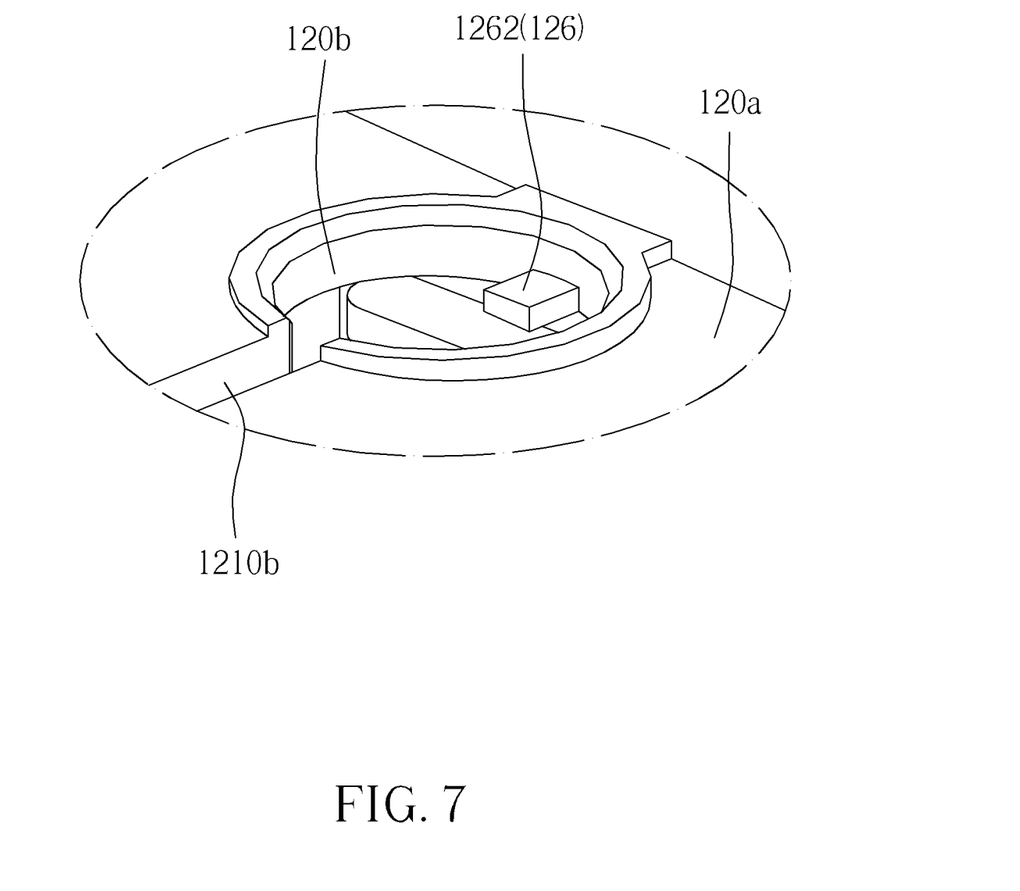
FIG. 7 is an enlarged view of the portion indicated by a circle in FIG. 6.

Please refer to FIGS. 3 through 7. FIG. 3 is a schematic diagram illustrating the electronic apparatus 1 with the door 122 opened in another view; therein, the door 122 is located at the open position. FIG. 4 is an enlarged view of the portion indicated by a circle in FIG. 3. FIG. 5 is a schematic diagram illustrating the engagement of the door 122 with a front cover 120a of the casing body 120 in another view; therein, for simplification of the drawing, other structures of the casing body 120 are not shown in FIG. 5, and the door 122 is located at the open position. FIG. 6 is an exploded view of the engagement of the door 122 with the casing body 120. FIG. 7 is an enlarged view of the portion indicated by a circle in FIG. 6. In more detail, the apparatus casing 12 further includes a pivotal device 124 and a pivot locking mechanism 126. The door 122 rotates relative to the casing body 120 by the pivotal device 124. The pivot locking mechanism 126 is used for locking or unlocking the pivotal device 124 to correspondingly prevent or allow rotating of the pivotal device 124 relative to the casing body 120. The pivotal device 124 includes a pivot 1242 and a torsion spring 1244. The torsion spring 1244 is disposed in a slot 1242a of the pivot 1242 for providing a restoring force to the pivot 1242. The pivotal device 124 is pivotally connected to a pivotal hole 120b of the front cover 120a at the first side 1202 of the casing body 120 by the pivot 1242. The pivot 1242 has a pivotal axial direction 1242b. The pivot locking mechanism 126 includes a locking part 1262, a slide 1264, and an elastic part 1266. The locking part 1262 is disposed on the inner wall of the pivotal hole 120b. The slide 1264 is disposed on an end portion of the pivot 1242 of the pivotal device 124 and extends perpendicular to the pivotal axial direction 1242b (i.e. the extension direction of the slide 1264 being perpendicular to the pivotal axial direction 1242b). The elastic part 1266 is disposed against and between the pivotal device 124 and the casing body 120. In the embodiment, the elastic part 1266 is of a cantilever structure fixed on the front cover 120a of the casing body 120. The free end of the cantilever structure is pivotally connected to the other end portion of the pivot 1242 so that when the elastic part 1266 deforms elastically, the elastic part 1266 can apply a restoring force to the pivot 1242. The pivot locking mechanism 126 locks the pivotal device 124 by inserting the locking part 1262 in the slide 1264. In addition, in logic, the elastic part 1266 is also used for the pivotal device 124 to be pivotally connected to the front cover 120a.

The casing body 120 includes a guiding structure 1210 at the first side 1202 for constraining the door 122 to slide parallel to a sliding direction 1210a at the first side 1202. In the embodiment, the guiding structure 1210 includes a slide 1210b formed on the front cover 120a and extending in the sliding direction 1210a. The door 122 includes an unlocking part 1222. The unlocking part 1222 can be used as an actuator for driving the pivot locking mechanism 126 to unlock the pivotal device 124 and also as a rectangular slider guided by the slide 1210b. Therefore, the guiding structure 1210 can slide in the slide 1210b by the unlocking part 1222 so as to structurally constrain the door 122 to slide only parallel to the sliding direction 1210a at the first side 1202. The guiding structure 1210 further includes an elastic part 1212 disposed at end portion 1210c of the slide 1210b. When the door 122 is located at the closed position (as shown by FIG. 1), the elastic part 1212 locks the unlocking part 1222 at the end portion 1210c. In the embodiment, the elastic part 1212 is of a cantilever structure including a protrusion portion 1212a protruding inside the slide 1210b at a free end 1212b of the cantilever structure. The elastic part 1212 holds the unlocking part 1222 by the protrusion portion 1212a at the end portion 1210c of the slide 1210b; however, the invention is not limited thereto. For example, the effect of holding the unlocking part 1222 at the end portion 1210c of the slide 1210b also can be performed by elastic deformation of a curved spring piece disposed on the side wall of the end portion 1210c of the slide 1210b.

Figure 8:
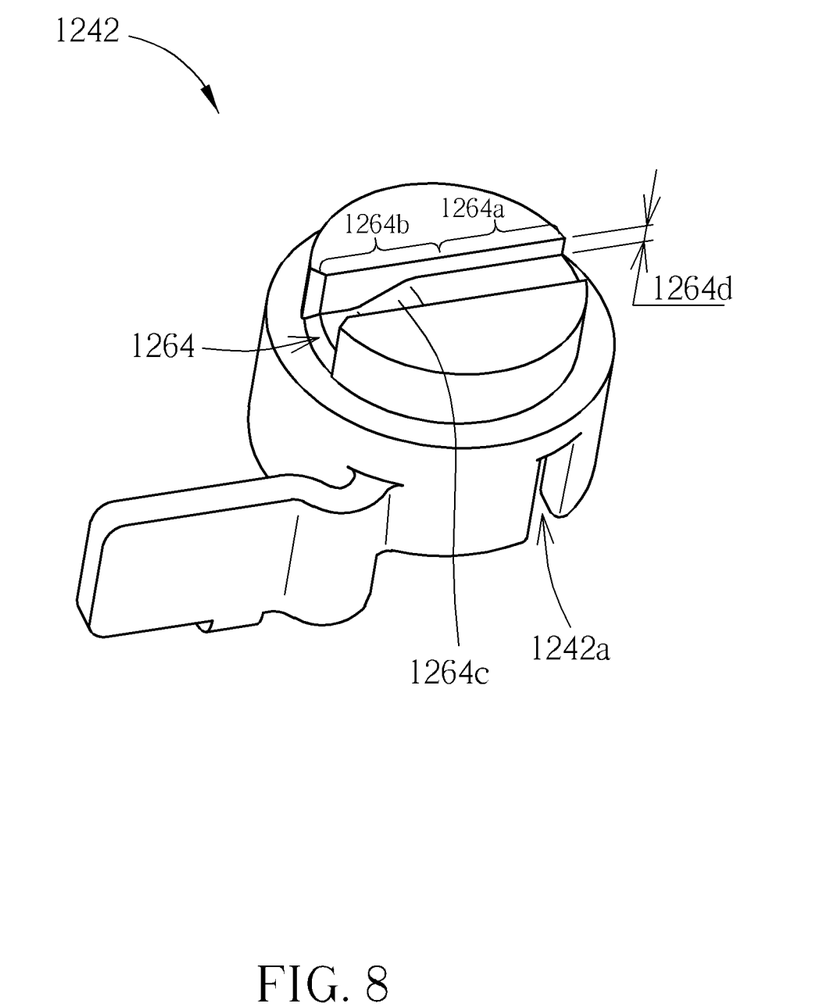
FIG. 8 is a schematic diagram illustrating a pivot in FIG. 6 in another view point.
Figure 9:
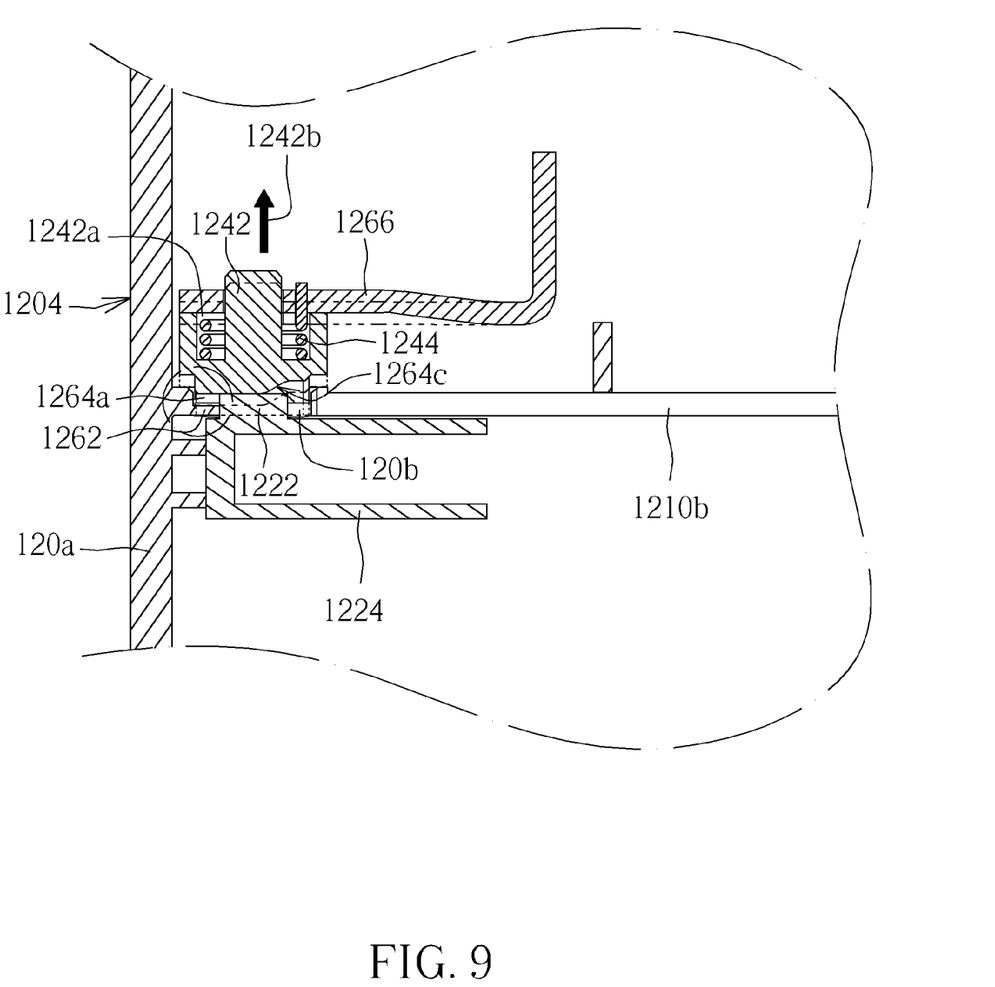
FIG. 9 is a sectional view of the front cover with the door located at the rotatable position.
Figure 10:
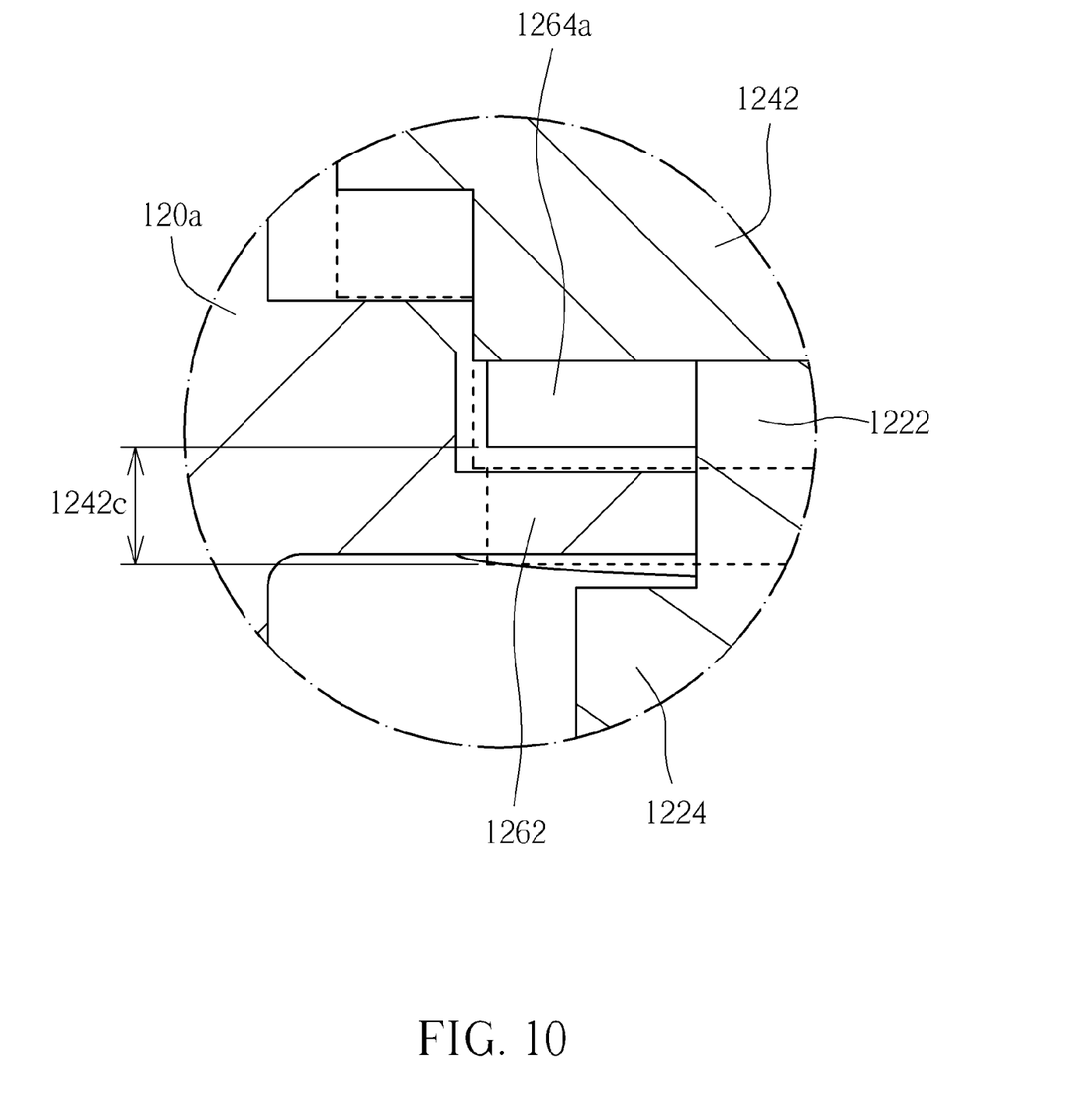
FIG. 10 is an enlarged view of the portion indicated by a circle in FIG. 9.

Under the constraint by the guiding structure 1210 on the door 122, a force can be applied to the door 122 so that the unlocking part 1222 can overcome the holding force by the elastic part 1212 to depart from the end portion 1210c of the slide 1210b and slide in the sliding direction 1210a. In the embodiment, the slide 1210b communicates in the sliding direction 1210a with the pivotal hole 120b formed on the front cover 120a, so the door 122 can keep sliding until the unlocking part 1222 enters the pivotal hole 120b. Please also refer to FIGS. 8 through 10. FIG. 8 is a schematic diagram illustrating the pivot 1242 in another view point relative to FIG. 6. FIG. 9 is a sectional view of the front cover 120a with the door 122 located at the rotatable position; the cutting plan thereof is parallel to the door 122 and passes through the slide 1210b. FIG. 10 is an enlarged view of the portion indicated by a circle in FIG. 9. As described above, the pivot 1242 is pivotally connected to the pivotal hole 120b. The slide 1264 of the pivot locking mechanism 126 includes a first portion 1264a and a second portion 1264b. The second portion 1264b has a ramp bottom surface 1264c. Therefore, before the unlocking part 1222 enters the pivotal hole 120b, the position of the pivot 1242 relative to the front cover 120a is shown by dashed lines in FIG. 9 and FIG. 10. At the moment, the pivot locking mechanism 126 locks the pivotal device 124 by inserting the locking part 1262 into the first portion 1264a, so that the pivot 1242 cannot rotate.

After entering the pivotal hole 120b, the unlocking part 1222 slides into the slide 1264 from the second portion 1264b. Then the unlocking part 1222 slides into the portion 1264a from the second portion 1264b and pushes against the ramp bottom surface 1264c to move the pivot 1242 of the pivotal device 124 in a shift distance 1242c in the pivotal axial direction 1242b so that the locking part 1262 departs from the first portion 1264a to unlock the pivotal device 124 and the elastic part 1266 deforms elastically. The elastic deformation of the elastic part 1266 produces a restoring force to the pivot 1242 for urging the pivot 1242 back to its original position. After the locking part 1262 departs from the first portion 1264a, the pivot 1242 of the pivotal device 124 is allowed to rotate relative to the front cover 120a. In principle, in order for the capability of the locking part 1262 to depart from the slide 1264 entirely, the shift distance 1242c is larger than a groove depth 1264d of the first portion 1264a (i.e. the depth of the portion 1264a in the pivotal axial direction 1242b). At the same time as the unlocking part 1222 unlocks the pivotal device 124, the door 122 slides in the slide 1264 by the unlocking part 1222 to be engaged with the pivotal device 124. At the moment, the door 122 is located at the rotatable position. The door 122 is capable of rotating relative to the casing body 120 by the pivotal device 124. Therein, the unlocking part 1222 is disposed on an extension arm 1224 of the door 122, so when rotating, the door 122 will not interfere with the front cover 120a of the casing body 120. When the unlocking part 1222 slides out of the slide 1264 of the pivot locking mechanism 126 into the slide 1210b of the guiding structure 1210 (e.g. the door 122 moving from the rotatable position toward the closed position), the restoring force produced by the elastic part 1266 drives the pivot 1242 back to its original position. The locking part 1262 is inserted in the slide 1264 again so as to lock the pivotal device 124; that is, the pivot 1242 cannot rotate relative to the casing body 120.

It is added that in the embodiment, the pivotal device 124 and the pivot locking mechanism 126 are disposed at a top side of the door 122, but in practice, it is practicable to disposed another pivotal device 124 and pivot locking mechanism 126 at a bottom side of the door 122. Furthermore, in the embodiment, the front cover 120a also forms another slide 1214 under the door 122. Accordingly, the door 122 includes another slider 1226 confined to be slidably disposed in the slide 1214. Such configuration is conducive to the stability of the door 122 sliding parallel to the sliding direction 1210a. It is added further that the embodiment is based on an integrated structure design. For example, the pivotal device 124 and the door 122 are engaged with each other by sliding the unlocking part 1222 into the slide 1264. Moreover, the unlocking part 1222 sliding into the slide 1264 also achieves the purpose of unlocking the pivot locking mechanism 126 for making the pivotal device 124 rotatable. In the integrated structure design, the unlocking part 1222 is taken as the actuator for driving the pivot locking mechanism 126 to unlock the pivotal device 124 and also as an engaging part of engaging the pivotal device 124 with the door 122. Similarly, the slide 1264 is taken as a locking slot for the locking part 1262 of the pivot locking mechanism 126 and also as an engaging part of engaging the pivotal device 124 with the door 122. For another example, the unlocking part 1222 is also taken as a matching part of matching the door 122 with the guiding structure 1210 of the front cover 120a. The unlocking part 1222 is also taken as a component of being held by the guiding structure 1210 for keeping the door 122 located at the closed position stably. The above integrated structure design is conducive to reduction of a component quantity, a component structural complexity and a required disposition room. However, the invention is not limited thereto. In practice, the mechanisms for the locking and unlocking of the pivotal device 124, the structurally constraint of the door 122 sliding at the first side 1202, the engagement of the door 122 with the pivotal device 124 and so on can be designed independently.

Afterward, the user can rotate the door 122 toward the second side 1204 relative to the casing body 120 until the door 122 approaches the second side 1204. Because two ends of the torsion spring 1244 are fixedly held on the pivot 1242 and the elastic part 1266 respectively, the torsion spring 1244 is twisted to store a restoring force during the above rotation of the door 122. At the moment, the door 122 is located at the open position, and the manipulation area 1208 is exposed entirely, as shown by the solid lines in FIG. 2. Therefore, the open operation of the door 122 is completed. On the whole, when the door 122 is located at the closed position, the door 122 covers the manipulation area 1208. The door 122 can slide parallel to the sliding direction 1210a by the guiding structure 1210 from the closed position to the rotatable position. When the door 122 is located at the rotatable position, the unlocking part 1222 departs from the slide 1210b, the door 122 is engaged with the pivotal device 124, and the unlocking part 1222 drives the pivot locking mechanism 126 to unlock the pivotal device 124, so that the door 122 can rotate relative to the casing body 120 by the pivotal device 124 from the rotatable position to the open position. When the door 122 is located at the open position, the door 122 is close to the second side 1204, and the manipulation area 1208 is exposed entirely, so that the device unit 14 can be manipulated through the manipulation area 1208. For example, the user can draw out the device unit 14 from the accommodating space 1206 through the manipulation area 1208, or perform inspection, setting or other operations on the device unit 14.

After the above operations on the device unit 14, the user can manipulate the door 122 in an order reverse to the operation order of the above opening operation so as to close the door 122. That is, the door 122 is rotated relative to the casing body 120 away from the second side 1204 till substantially parallel to the first side 1202, i.e. rotating from the open position to the rotatable position. Then, the door 122 is slid parallel to the sliding direction 1210a for covering the manipulation area 1208, i.e. sliding from the rotatable position to the closed position. Therein, the restoring force stored by the torsion spring 1244 due to suffering the torsion is conducive to the rotation operation of the door 122 from the open position to the rotatable position. Furthermore, once the unlocking part 1222 departs from the slide 1264 of the pivot locking mechanism 126 (namely the slide 1264 of the pivotal device 124) to enter into the slide 1210b of the guiding structure 1210, the pivot 1242 is driven by the restoring force provided by the elastic part 1266 to move parallel to the pivotal axial direction 1242b back to its original position so that the locking part 1262 is engaged with the slide 1264 again and the pivotal device 124 is locked again. When the door 122 is located at the closed position, the unlocking part 1222 reaches the end portion 1210c of the slide 1210b again and is held by the elastic part 1212 so that the door 122 can keep at the closed position stably. At the moment, the door 122 returns back to the closed position again. The manipulation area 1208 is covered by the door 122. The apparatus casing 12 keeps its aesthetic appearance.

It is added that when the door 122 is located at the rotatable position, the manipulation area 1208 is partially exposed. In practice, if the exposed area of the manipulation area 1208 is sufficient for the user to perform effective operation to the device unit 14, it is applicable for the user to open the door 122 just to the rotatable position. The invention is not limited to the case that the user does not operate the device unit 14 until the door 122 is totally opened.

As discussed above, during the opening and closing the door 122, an inner surface 122a of the door 122 (referring to FIG. 5 or FIG. 6) always faces the casing body 120. That is, when the door 122 is located at the closed position, the inner surface 122a faces the first side 1202; when the door 122 is located at the rotatable position, the inner surface 122a faces backward relative to the user (being in front of the first side 1202 of the casing body 120); when the door 122 is located at the open position, the inner surface 122a faces toward the second side 1204. The mechanism of opening and closing the door 122 makes the apparatus casing 12 able to keep it aesthetic appearance even during the opening of the door 122 for manipulating the device unit 14. In addition, during the opening of the door 122, the door 122 slides prone on the first side 1202 substantially first, so that the user in front of the first side 1202 of the casing body 120 will not be interrupted by the opening of the door 122 and need not dodge back. Such design improves the manipulation convenience.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A cover mechanism for an apparatus casing, comprising:
   a casing body having a first side and a second side adjacent to the first side, the casing body comprising a guiding structure at the first side, the casing body thereon defining a manipulation area at the first side;
   a pivotal device pivotally connected to the casing body;
   a pivot locking mechanism for locking or unlocking the pivotal device to correspondingly prevent or allow rotating of the pivotal device relative to the casing body; and
   a door comprising an unlocking part, the door being structurally constrained by the guiding structure so as to be capable of sliding in a sliding direction at the first side, the unlocking part being capable of driving the pivot locking mechanism to unlock the pivotal device;
   wherein the door has a closed position, a rotatable position, and an open position, when the door is located at the closed position, the door covers the manipulation area and is disengaged from the pivotal device, the door is capable of sliding parallel to the sliding direction from the closed position to the rotatable position by the guiding structure, and the pivot locking mechanism locks the pivotal device from rotating until the door reaches the rotatable position from the closed position;
   when the door is located at the rotatable position, the door is engaged with the pivotal device, and the unlocking part drives the pivot locking mechanism to unlock the pivotal device so that the door is capable of rotating from the rotatable position to the open position relative to the casing body by the pivotal device; and
   when the door is located at the open position, the door is close to the second side, and the manipulation area is exposed.

2. The cover mechanism of claim 1, wherein the door slides from the closed position to the rotatable position by the guiding structure to be engaged with the pivotal device.

3. The cover mechanism of claim 2, wherein the door is engaged with the pivotal device by the unlocking part.

4. The cover mechanism of claim 3, wherein the pivotal device comprises a slide, and the door slides into the slide by the unlocking part to be engaged with the pivotal device.

5. The cover mechanism of claim 1, wherein the pivotal device has a pivotal axial direction, the pivot locking mechanism comprises a locking part and a slide, the locking part is disposed on the casing body, the slide is disposed on the pivotal device and extends in a direction perpendicular to the pivotal axial direction, and the pivot locking mechanism locks the pivotal device by inserting the locking part into the slide.

6. The cover mechanism of claim 5, wherein the pivot locking mechanism comprises an elastic part, the elastic part is disposed against and between the pivotal device and the casing body, the slide comprises a first portion and a second portion, the second portion has a ramp bottom surface, the pivot locking mechanism locks the pivotal device by inserting the locking part into the first portion, when the door is located at the rotatable position, the unlocking part slides into the first portion from the second portion and pushes the ramp bottom surface to move the pivotal device a shift distance in the pivotal axial direction so that the locking part departs from the first portion to unlock the pivotal device, and the elastic part deforms elastically, and the shift distance is larger than a groove depth of the first portion.

7. The cover mechanism of claim 6, wherein the elastic part is of a cantilever structure fixed on the casing body, and the pivotal device is pivotally connected to a free end of the cantilever structure.

8. The cover mechanism of claim 6, wherein the door slides into the slide by the unlocking part to be engaged with the pivotal device.

9. The cover mechanism of claim 1, wherein the guiding structure comprises a slide, the guiding structure structurally constraining the door by the unlocking part sliding in the slide so that the door is capable of sliding in the sliding direction at the first side, and when the door is located at the rotatable position, the unlocking part departs from the slide.

10. The cover mechanism of claim 9, wherein the guiding structure comprises an elastic part disposed at an end portion of the slide, and when the door is located at the closed position, the elastic part holds the unlocking part at the end portion.

11. The cover mechanism of claim 10, wherein the elastic part is of a cantilever structure, the cantilever structure comprises a protrusion portion protruding inside the slide at a free end of the cantilever structure, and the elastic part holds the unlocking part by the protrusion portion at the end portion of the slide.

12. An electronic apparatus, comprising:
an apparatus casing, comprising:
- a casing body having a first side and a second side adjacent to the first side, the casing body forming an accommodating space, the casing body comprising a guiding structure at the first side, the casing body thereon defining a manipulation area at the first side corresponding to the accommodating space;
- a pivotal device pivotally connected to the casing body;
- a pivot locking mechanism for locking or unlocking the pivotal device to correspondingly prevent or allow rotating of the pivotal device relative to the casing body; and
- a door comprising an unlocking part, the door being structurally constrained by the guiding structure so as to be capable of sliding in a sliding direction at the first side, the unlocking part being capable of driving the pivot locking mechanism to unlock the pivotal device; and
- a device unit disposed in the accommodating space corresponding to the manipulation area;

wherein the door has a closed position, a rotatable position, and an open position, when the door is located at the closed position, the door covers the manipulation area and is disengaged from the pivotal device, the door is capable of sliding parallel to the sliding direction from the closed position to the rotatable position by the guiding structure, and the pivot locking mechanism locks the pivotal device from rotating until the door reaches the rotatable position from the closed position;

when the door is located at the rotatable position, the door is engaged with the pivotal device, and the unlocking part drives the pivot locking mechanism to unlock the pivotal device so that the door is capable of rotating from the rotatable position to the open position relative to the casing body by the pivotal device; and when the door is located at the open position, the door is close to the second side, and the manipulation area is exposed so that the device unit is capable of being manipulated through the manipulation area.

13. The electronic apparatus of claim 12, wherein the door slides from the closed position to the rotatable position by the guiding structure to be engaged with the pivotal device.

14. The electronic apparatus of claim 13, wherein the door is engaged with the pivotal device by the unlocking part.

15. The electronic apparatus of claim 14, wherein the pivotal device comprises a slide, and the door slides into the slide by the unlocking part to be engaged with the pivotal device.

16. The electronic apparatus of claim 12, wherein the pivotal device has a pivotal axial direction, the pivot locking mechanism comprises a locking part and a slide, the locking part is disposed on the casing body, the slide is disposed on the pivotal device and extends in a direction perpendicular to the pivotal axial direction, and the pivot locking mechanism locks the pivotal device by inserting the locking part into the slide.

17. The electronic apparatus of claim 16, wherein the pivot locking mechanism comprises an elastic part, the elastic part is disposed against and between the pivotal device and the casing body, the slide comprises a first portion and a second portion, the second portion has a ramp bottom surface, the pivot locking mechanism locks the pivotal device by inserting the locking part into the first portion, when the door is located at the rotatable position, the unlocking part slides into the first portion from the second portion and pushes the ramp bottom surface to move the pivotal device move a shift distance in the pivotal axial direction so that the locking part departs from the first portion to unlock the pivotal device, and the elastic part deforms elastically, and the shift distance is larger than a groove depth of the first portion.

18. The electronic apparatus of claim 17, wherein the elastic part is of a cantilever structure fixed on the casing body, and the pivotal device is pivotally connected to a free end of the cantilever structure.

19. The electronic apparatus of claim 17, wherein the door slides into the slide by the unlocking part to be engaged with the pivotal device.

20. The electronic apparatus of claim 12, wherein the guiding structure comprises a slide, the guiding structure structurally constraining the door by the unlocking part sliding in the slide so that the door is capable of sliding in the sliding direction at the first side, and when the door is located at the rotatable position, the unlocking part departs from the slide.

21. The electronic apparatus of claim 20, wherein the guiding structure comprises an elastic part disposed at an end portion of the slide, and when the door is located at the closed position, the elastic part holds the unlocking part at the end portion.

22. The electronic apparatus of claim 21, wherein the elastic part is of a cantilever structure, the cantilever structure comprises a protrusion portion protruding inside the slide at a free end of the cantilever structure, and the elastic part holds the unlocking part by the protrusion portion at the end portion of the slide.

23. The electronic apparatus of claim 12, wherein the device unit is a removable device, and when the door is located at the open position, the device unit is capable of being drawn out from the accommodating space through the manipulation area.

* * * * *